(12) United States Patent
Sato et al.

(10) Patent No.: US 10,392,714 B2
(45) Date of Patent: Aug. 27, 2019

(54) ARTIFICIAL-PHOTOSYNTHESIS MODULE

(71) Applicants: FUJIFILM Corporation, Tokyo (JP);
JAPAN TECHNOLOGICAL RESEARCH ASSOCIATION OF ARTIFICAL PHOTOSYNTHETIC CHEMICAL PROCESS, Tokyo (JP);
THE UNIVERSITY OF TOKYO, Tokyo (JP)

(72) Inventors: Naotoshi Sato, Kashiwa (JP);
Kazunari Domen, Tokyo (JP); Jiro Tsukahara, Kashiwa (JP)

(73) Assignees: FUJIFILM Corporation, Tokyo (JP);
JAPAN TECHNOLOGICAL RESEARCH ASSOCIATION OF ARTIFICIAL PHOTOSYNTHETIC CHEMICAL PROCESS, Tokyo (JP);
THE UNIVERSITY OF TOKYO, Tokyo (JP)

( * ) Notice: Subject to any disclaimer, the term of this patent is extended or adjusted under 35 U.S.C. 154(b) by 327 days.

(21) Appl. No.: 15/178,962

(22) Filed: Jun. 10, 2016

(65) Prior Publication Data

US 2016/0281242 A1    Sep. 29, 2016

Related U.S. Application Data

(63) Continuation of application No. PCT/JP2014/080800, filed on Nov. 20, 2014.

(30) Foreign Application Priority Data

Dec. 13, 2013    (JP) .................................. 2013-258541

(51) Int. Cl.
*C25B 9/00*      (2006.01)
*C25B 9/18*      (2006.01)
(Continued)

(52) U.S. Cl.
CPC ................ *C25B 1/003* (2013.01); *C25B 1/04* (2013.01); *C25B 1/10* (2013.01); *C25B 9/08* (2013.01);
(Continued)

(58) Field of Classification Search
CPC .... C25B 1/10; C25B 1/04; C25B 9/00; C25B 1/003; C25B 1/02; C25B 9/18; C25B 9/16; C25B 3/02; C25B 3/04
(Continued)

(56) References Cited

U.S. PATENT DOCUMENTS

| 6,198,037 B1 * | 3/2001 | Nakata | .................... C25B 1/003 |
| | | | 136/246 |
| 2010/0090218 A1 * | 4/2010 | Tsukahara | ........... H01L 29/7869 |
| | | | 257/43 |

(Continued)

FOREIGN PATENT DOCUMENTS

| JP | 8-125210 A | 5/1996 |
| JP | 2004-197167 A | 7/2004 |

(Continued)

OTHER PUBLICATIONS

International Search Report for PCT/JP2014/080800 dated Feb. 17, 2015.
(Continued)

*Primary Examiner* — Zulmariam Mendez
(74) *Attorney, Agent, or Firm* — Birch, Stewart, Kolasch & Birch, LLP

(57) ABSTRACT

Provided is an artificial-photosynthesis module, which decomposes an aqueous electrolyte solution into hydrogen and oxygen by means of light, including a photoelectric conversion unit that receives light to generate electrical energy; a hydrogen gas generating part that decomposes the aqueous electrolyte solution, using the electrical energy of (Continued)

the photoelectric conversion unit, and generates hydrogen gas; and an oxygen gas generating part that decomposes the aqueous electrolyte solution, using the electrical energy of the photoelectric conversion unit, and generates oxygen gas. The photoelectric conversion unit, the hydrogen gas generating part, and the oxygen gas generating part are electrically connected in series, and the hydrogen gas generating part and the oxygen gas generating part are arranged within an electrolytic chamber to which the aqueous electrolyte solution is supplied. The hydrogen gas generating part has an inorganic semiconductor film having a pn junction.

18 Claims, 5 Drawing Sheets

(51) Int. Cl.
  *C25B 1/00* (2006.01)
  *H01L 31/072* (2012.01)
  *H01L 31/0749* (2012.01)
  *C25B 15/02* (2006.01)
  *C25B 1/04* (2006.01)
  *C25B 9/08* (2006.01)
  *C25B 1/10* (2006.01)
  *C25B 11/04* (2006.01)
  *C25B 15/08* (2006.01)
  *H01L 31/032* (2006.01)
  *H01L 31/042* (2014.01)

(52) U.S. Cl.
  CPC ...... *C25B 11/0447* (2013.01); *C25B 11/0452* (2013.01); *C25B 15/02* (2013.01); *C25B 15/08* (2013.01); *H01L 31/0322* (2013.01); *H01L 31/0326* (2013.01); *H01L 31/042* (2013.01); *H01L 31/072* (2013.01); *H01L 31/0749* (2013.01); *Y02E 10/541* (2013.01); *Y02E 60/368* (2013.01); *Y02P 70/521* (2015.11)

(58) Field of Classification Search
  USPC .......................................................... 204/266
  See application file for complete search history.

(56) References Cited

U.S. PATENT DOCUMENTS

| 2013/0180862 A1 | 7/2013 | Yoshida et al. |
| 2015/0068915 A1* | 3/2015 | Hoch ................... C25B 1/04 205/340 |

FOREIGN PATENT DOCUMENTS

| JP | 2005-133174 A | 5/2005 |
| JP | 2007-239048 A | 9/2007 |
| JP | 2008-507464 A | 3/2008 |
| JP | 2012-21197 A | 2/2012 |
| JP | 2012-72434 A | 4/2012 |
| JP | 2013-105631 A | 5/2013 |

OTHER PUBLICATIONS

Written Opinion of the International Searching Authority for PCT/JP2014/080800 (PCT/ISA/237) dated Feb. 17, 2015.
Yokoyama et al., "$H_2$ Evolution from Water on Modified $Cu_2ZnSnS_4$ Photoelectrode under Solar Light", Applied Physics Express 3 (2010), pp. 101202-1-101202-3.
Japanese Office Action issued in Japanese Application No. 2013-258541 dated Jul. 4, 2017, together with an English translation.
Japanese Office Action issued in Japanese Patent Application No. 2013-258541 dated Jan. 30, 2017.
International Preliminary Report on Patentability and English translation of the Written Opinion of the International Searching Authority (Forms PCT/IB/338, PCT/IB/373 and PCT/ISA/237), dated Jun. 23, 2016, for International Application No. PCT/JP2014/080800.

\* cited by examiner

ARTIFICIAL-PHOTOSYNTHESIS MODULE

CROSS-REFERENCE TO RELATED APPLICATIONS

This application is a Continuation of PCT International Application No. PCT/JP2014/080800 filed on Nov. 20, 2014, which claims priority under 35 U.S.C. § 119(a) to Japanese Patent Application No. 2013-258541 filed on Dec. 13, 2013. The above application is hereby expressly incorporated by reference, in its entirety, into the present application.

BACKGROUND OF THE INVENTION

1. Field of the Invention

The present invention relates to an artificial-photosynthesis module that receives light to electrolyze water and decompose the water into hydrogen and oxygen, using photoelectric conversion elements, and particularly, an artificial-photosynthesis module that can adjust a voltage required for electrolysis of water.

2. Description of the Related Art

In the related art, as one form of using solar light energy that is a renewable energy, there is suggested a hydrogen manufacturing apparatus that utilizes electrons and positive holes obtained by photoelectric conversion for a decomposition reaction of water, using a photoelectric conversion material used for solar batteries, and thereby manufactures hydrogen used for fuel cells or the like (for example, refer to JP2004-197167A).

In the hydrogen manufacturing apparatus disclosed in JP2004-197167A, a photoelectric conversion part or a solar battery in which two or more pn junctions that generate an electromotive force if solar light enters are connected in series is provided, an electrolytic solution chamber is provided on a lower side of the photoelectric conversion part or the solar battery opposite to a light-receiving surface that receives solar light on an upper side of the photoelectric conversion part or the solar battery, the inside of an electrolytic chamber is divided by the ion-conducting partition wall or a diaphragm, and water is electrolyzed and hydrogen is generated by the electrical energy generated in the photoelectric conversion part or the solar battery by receiving solar light.

In JP2004-197167A, a GaAs solar battery with an electromotive force of 0.9 V and a GaAs solar battery with an electromotive force of 1.7 V are used, the values of currents to be generated are equal, and the sum of the electromotive forces is made equal to or higher than a practical electrolysis start voltage, that is, equal to or higher than a voltage required for electrolysis of water.

Additionally, in JP2004-197167A, water is electrolyzed by using electrode plates connected to p-type and n-type semiconductors of the solar battery as an anode and a cathode, respectively. Thus, the conversion efficiency from solar energy to hydrogen can be made high.

SUMMARY OF THE INVENTION

As in JP2004-197167A, water is electrolyzed by the electrical energy generated in a photoelectric conversion part or a solar battery by the reception of solar light, and thereby hydrogen is generated.

For example, in a case where the voltage required for electrolysis of water is 2.0 V, and as in JP2004-197167A, in a case where a GsAs solar battery with an electromotive force of 0.9 V and a GaAs solar battery with an electromotive force of 1.7 V are used, (0.9 V+1.7 V)−2.0 V=0.6 V is surplus, and an energy loss equivalent to 0.6 V occurs.

In addition to this, in the related art, the voltage of a power source part 102 in which photoelectric conversion elements are connected in series is adjusted, as in a related-art water electrolysis illustrated in FIG. 5. This adjustment of the voltage is made by changing the number of serially connected photoelectric conversion elements that constitute the power source part 102. The power source part 102 is connected to a cathode 104 for generation of hydrogen and an anode electrode 106 for generation of oxygen. The cathode 104 and the anode electrode 106 are installed in a container 110 filled with an aqueous electrolyte solution 108.

In this case, if the electromotive force per one photoelectric conversion element is set to 0.8 V, the sum of the electromotive forces is 1.6 V in two serial connections, and water cannot be electrolyzed. Meanwhile, the sum of the electromotive forces is 2.4 V in three serial connections, 0.4 V is surplus, and an energy loss equivalent to 0.4 V occurs.

In this way, there are problems in that it is difficult to guarantee an optimum electromotive force with respect to the practical electrolysis start voltage (the voltage required for electrolysis of water) of water, and surplus electrical energy corresponding to a surplus voltage with respect to the practical electrolysis start voltage of water becomes useless.

An object of the invention is to solve the problems based on the related art and provide an artificial-photosynthesis module that can adjust a voltage required for electrolysis of water and that can reduce surplus energy.

In order to achieve the above object, the invention provides an artificial-photosynthesis module that decomposes an aqueous electrolyte solution into hydrogen and oxygen by means of light. The artificial-photosynthesis module comprises a photoelectric conversion unit that receives light to generate electrical energy; a hydrogen gas generating part that decomposes the aqueous electrolyte solution, using the electrical energy of the photoelectric conversion unit, and generates hydrogen gas; and an oxygen gas generating part that decomposes the aqueous electrolyte solution, using the electrical energy of the photoelectric conversion unit, and generates oxygen gas. The photoelectric conversion unit, the hydrogen gas generating part, and the oxygen gas generating part are electrically connected in series, and the hydrogen gas generating part and the oxygen gas generating part are arranged within an electrolytic chamber to which the aqueous electrolyte solution is supplied. The hydrogen gas generating part has an inorganic semiconductor film having a pn junction.

It is preferable that the hydrogen gas generating part and the oxygen gas generating part are provided on the same plane. The hydrogen gas generating part and the oxygen gas generating part may be provided on mutually different planes.

It is preferable that a plurality of photoelectric conversion elements of the photoelectric conversion unit are connected in series.

It is preferable that each of the photoelectric conversion elements includes an inorganic semiconductor film having a pn junction.

It is preferable that the inorganic semiconductor film has an absorption wavelength end of 800 nm or more, and for example, the inorganic semiconductor film includes a CIGS compound semiconductor or a CZTS compound semiconductor.

Moreover, it is preferable that the inorganic semiconductor film of the hydrogen gas generating part is covered with a functional layer, and the functional layer is insoluble in a weak acidic solution and a weak alkaline solution, and has all of light permeability, water impermeability, and conductivity.

Additionally, it is preferable that the functional layer has a co-catalyst provided on the surface thereof and is made of a metal or a conductive oxide (the overvoltage thereof is equal to or less than 0.5 V) or a complex thereof, and the co-catalyst is made of Pt, a substance containing Pt, or Rh.

Moreover, it is preferable that the photoelectric conversion unit is covered with a protective layer, and the protective layer is insoluble in a weak acidic solution and a weak alkaline solution, and has all light permeability, water impermeability, and insulation.

It is preferable that a co-catalyst is provided in the oxygen gas generating part, and the co-catalyst for the oxygen generation is made of $CoO_x$ or $IrO_2$.

It is preferable that, when the photoelectric conversion unit is irradiated with light, the amounts of generated currents generated in the respective photoelectric conversion elements are equal in the respective photoelectric conversion elements.

According to the invention, adjustment of the voltage applied to the electrolytic chamber becomes possible, and a surplus voltage with respect to the voltage required for electrolysis can be reduced. Additionally, since the electrical energy generated in the photoelectric conversion unit can be used for water electrolysis, with none being left over, hydrogen can be cheaply manufactured.

Additionally, by providing the electrolytic chamber, it is unnecessary to perform immersion in the aqueous electrolyte solution, and degradation of performance caused by immersion can be avoided.

Moreover, since water is electrolyzed and hydrogen gas and oxygen gas are obtained within the electrolytic chamber, the area of the electrolytic chamber can be made small.

DESCRIPTION OF THE PREFERRED EMBODIMENTS

Hereinafter, an artificial-photosynthesis module of the invention will be described in detail with reference to preferred embodiments illustrated in the attached drawings.

Figure 1:
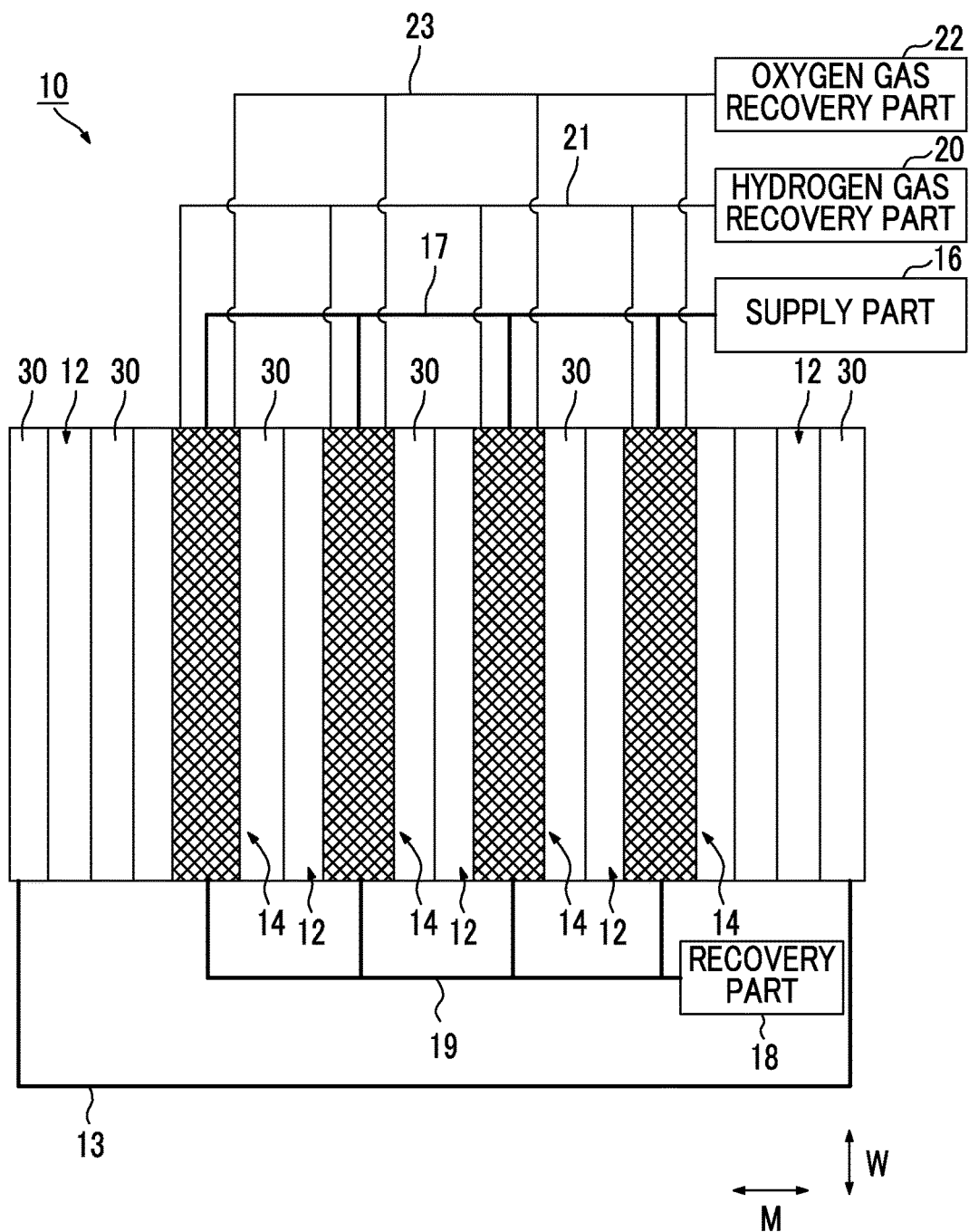
FIG. 1 is a schematic plan view illustrating an artificial-photosynthesis module of a first embodiment of the invention.
Figure 2:
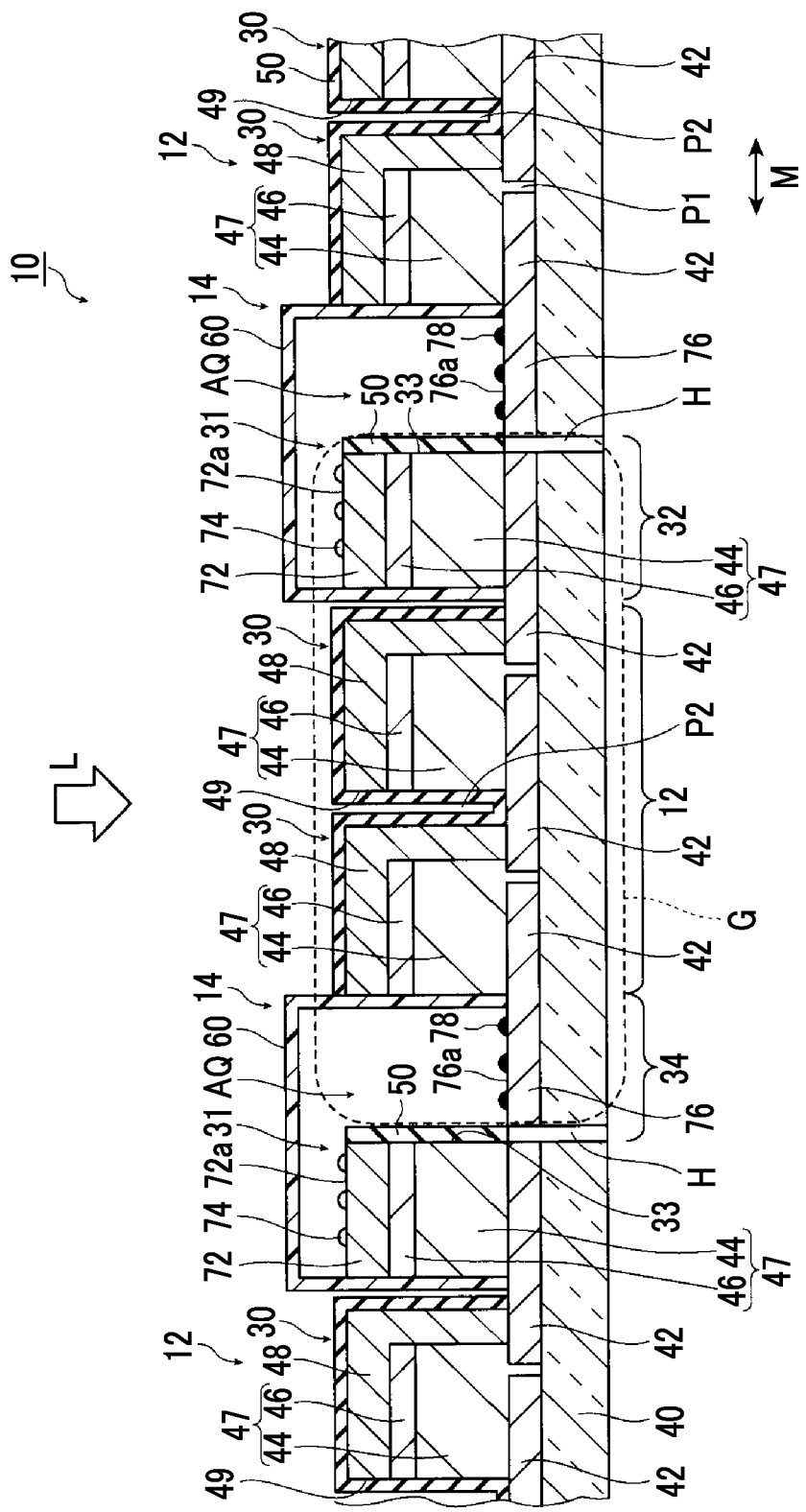
FIG. 2 is a schematic sectional view of main parts of the artificial-photosynthesis module illustrated in FIG. 1.

FIG. 1 is a schematic plan view illustrating an artificial-photosynthesis module of a first embodiment of the invention, and FIG. 2 is a schematic sectional view of main parts of the artificial-photosynthesis module illustrated in FIG. 1.

As illustrated in FIG. 1, the artificial-photosynthesis module 10 has, for example, a plurality of photoelectric conversion units 12 and a plurality of electrolytic chambers 14.

In the artificial-photosynthesis module 10, each electrolytic chamber 14 is arranged in a direction M between the photoelectric conversion units 12, and the photoelectric conversion units 12 and the electrolytic chambers 14 are electrically connected in series. The photoelectric conversion units 12 located at the respective ends in the direction M are connected together with, for example, wiring 13, in an arrangement state thereof. In addition, the photoelectric conversion units 12 located at the respective ends are not limited to being connected together via the wiring 13, and for example, the photoelectric conversion units 12 at the respective ends may be grounded, respectively.

Each photoelectric conversion unit 12 is provided to receive light to generate electrical energy and to supply electrical energy for generating oxygen gas in an oxygen gas generating part 34 to be described below and electrical energy for generating hydrogen gas in a hydrogen gas generating part 32 to be described below. A generation voltage and a generated current are included in the electrical energy generated in the photoelectric conversion unit 12.

The photoelectric conversion unit 12 has at least one photoelectric conversion element 30. As will be described below, in an example illustrated in FIGS. 1 and 2, the photoelectric conversion unit 12 is a cascade type integrated element in that two or more, that is, a plurality of the photoelectric conversion elements 30 are electrically connected in series.

An aqueous electrolyte solution AQ is supplied to each electrolytic chamber 14 as will be described below. In the electrolytic chamber 14, the aqueous electrolyte solution AQ is decomposed using an electromotive force generated in the photoelectric conversion unit 12, and hydrogen gas and oxygen gas are generated within the electrolytic chamber 14.

Here, the aqueous electrolyte solution AQ is, for example, a liquid using $H_2O$ as a main component, may be distilled water, or may be an aqueous solution using water as a solvent and containing solute. Water, for example, may be an electrolytic solution that is an aqueous solution containing an electrolyte, or may be cooling water used in a cooling tower or the like. The electrolytic solution is, for example, an aqueous solution containing an electrolyte, and is, for example, strong alkali (KOH), a polymer electrolyte (NAFION (registered trademark)), an electrolytic solution containing 0.1 M of $H_2SO_4$, a 0.1-M sodium sulfate electrolytic solution, a 0.1-M disodium hydrogen phosphate electrolytic solution, a 0.1-M potassium phosphate buffer solution, or the like.

The artificial-photosynthesis module 10 has a supply part 16 for supplying the aqueous electrolyte solution AQ to the electrolytic chambers 14, and a recovery part 18 that recovers the aqueous electrolyte solutions AQ discharged from the electrolytic chambers 14.

As the supply part 16 and the recovery part 18, a well-known water supply device, such as a pump, is available, and a well-known water recovery device, such as a tank, is available.

The supply part 16 is connected to the electrolytic chambers 14 via a supply tube 17, and the recovery part 18 is connected to the electrolytic chambers 14 via a recovery pipe 19. The aqueous electrolyte solution AQ recovered by the recovery part 18 may be made to circulate through the supply part 16, and the aqueous electrolyte solution AQ may be reused.

Moreover, the artificial-photosynthesis module 10 has a hydrogen gas recovery part 20 that recovers the hydrogen gas generated in the electrolytic chambers 14, and an oxygen gas recovery part 22 that recovers the oxygen gas generated in the electrolytic chambers 14.

The hydrogen gas recovery part 20 is connected to the electrolytic chambers 14 via a pipe 21 for hydrogen, and the oxygen gas recovery part 22 is connected to the electrolytic chambers 14 via a pipe 23 for oxygen.

The configuration of the hydrogen gas recovery part 20 is not particularly limited if the hydrogen gas recovery part can recover hydrogen gas, and, for example, devices using an adsorption process, a diaphragm process, and the like may be used.

The configuration of the oxygen gas recovery part 22 is not particularly limited if the oxygen gas recovery part can recover oxygen gas, and, for example, a device using an adsorption process may be used.

In addition, the artificial-photosynthesis module 10 may be inclined at a predetermined angle with respect to a width direction W. Accordingly, the aqueous electrolyte solution AQ becomes apt to move to the recovery pipe 19 side, and the efficiency of generation of hydrogen gas and oxygen gas can be made high. The hydrogen gas and the oxygen gas become apt to move to the supply tube 17 side, and the hydrogen gas and the oxygen gas can be recovered efficiently.

Next, the artificial-photosynthesis module 10 will be specifically described below.

As illustrated in FIG. 2, the artificial-photosynthesis module 10 is an integrated structure having a photoelectric conversion unit 12, a hydrogen gas generating part 32, and an oxygen gas generating part 34 on a planar insulating substrate 40, that is, on the same plane. The hydrogen gas generating part 32 and the oxygen gas generating part 34 are arranged with the photoelectric conversion unit 12 interposed therebetween, and the photoelectric conversion unit 12, the hydrogen gas generating part 32, and the oxygen gas generating part 34 are electrically connected in series.

In addition, the photoelectric conversion unit 12, the hydrogen gas generating part 32, and the oxygen gas generating part 34 are collectively referred to as a water-decomposing element G.

In the artificial-photosynthesis module 10, water-decomposing elements G adjacent to each other are arranged so that the hydrogen gas generating part 32 and the oxygen gas generating part 34 are adjacent to each other, and the hydrogen gas generating part 32 and the oxygen gas generating part 34 of water-decomposing elements G different from each other are housed within the same electrolytic chamber 14. A groove H that passes through a back electrode 42 and the insulating substrate 40 is formed between the hydrogen gas generating part 32 and the oxygen gas generating part 34 of the water-decomposing elements G adjacent to each other, and the water-decomposing elements G are separated from each other by the groove H. Each water-decomposing element G is not formed over the entire region in the width direction W of the insulating substrate 40, and the groove H for element separation is not formed over the entire region in the width direction W of the insulating substrate 40.

In addition, if the hydrogen gas generating part 32 and the oxygen gas generating part 34 can be electrically insulated within the electrolytic chamber 14, an element separation method is not particularly limited. For example, a groove up to the surface of the insulating substrate 40 can be formed in the back electrode 42, and the elements can be separated by filming the groove with an insulating material.

The electrolytic chamber 14 is formed by a container 60 provided on the insulating substrate 40.

The photoelectric conversion element 30 is configured so that the back electrode 42, a photoelectric conversion layer 44, a buffer layer 46, a transparent electrode 48, and a protective layer 50 are laminated sequentially from the insulating substrate 40 side.

In the photoelectric conversion element 30, a pn junction is formed at the interface between the photoelectric conversion layer 44 and the buffer layer 46. In addition, the photoelectric conversion layer 44 and the buffer layer 46 constitute an inorganic semiconductor film 47 having a pn junction.

The protective layer 50 is insoluble in a weak acidic solution and a weak alkaline solution, and has light permeability, water impermeability, and insulation together.

The protective layer 50 has translucency and is provided to protect the photoelectric conversion element 30 and the hydrogen gas generating part 32, and covers the whole surface of the transparent electrode 48, a side surface 49 of the photoelectric conversion element 30, and a side surface 33 of the hydrogen gas generating part 32 (pn junction cell 31).

The protective layer 50 is made of, for example, $SiO_2$, $SnO_2$, $Nb_2O_5$, $Ta_2O_5$, $Al_2O_3$, $Ga_2O_3$, or the like. Additionally, the thickness of the protective layer 50 is not particularly limited, and is preferably 100 nm to 1000 nm.

In addition, methods for forming the protective layer 50 are not particularly limited, and the protective layer 50 can be formed by an RF sputtering method, a DC reactive sputtering method, a MOCVD method, and the like.

Additionally, the protective layer 50 may be made of, for example, insulating epoxy resin, insulating silicone resin, insulating fluororesin, or the like. In this case, the thickness of the protective layer 50 is not particularly limited and is preferably 2 μm to 1000 μm.

In the photoelectric conversion unit 12, two photoelectric conversion elements 30 are connected in series in the direction M. However, the number of photoelectric conversion elements is not limited and may be one or three or more as long as an electromotive force that can generate hydrogen gas and oxygen gas can be generated. If the plurality of photoelectric conversion elements 30 are connected in series, a higher voltage can be obtained, and a voltage generated in the entire artificial-photosynthesis module 10 can be adjusted. Therefore, it is preferable that the plurality of photoelectric conversion elements 30 are connected in series.

The hydrogen gas generating part 32 is configured so that the back electrode 42, the photoelectric conversion layer 44, the buffer layer 46, and the functional layer 72 are laminated sequentially from the insulating substrate 40 side. In the hydrogen gas generating part 32, a pn junction is formed at the interface between the photoelectric conversion layer 44 and the buffer layer 46, and the photoelectric conversion layer 44 and the buffer layer 46 constitute the inorganic semiconductor film 47.

A co-catalyst 74 for promoting generation of hydrogen is formed in the shape of lands so as to be dotted on a surface 72a of the functional layer 72. In addition, a laminated structure of the back electrode 42, the photoelectric conversion layer 44, and the buffer layer 46 is also referred to as a pn junction cell 31.

The functional layer 72 constitutes the hydrogen gas generating part 32, and a transparent conductive protective film is used as the functional layer. The functional layer 72 is insoluble in a weak acidic solution and a weak alkaline solution, and has all of light permeability, water impermeability, and conductivity.

The functional layer 72 supplies electrons to hydrogen ions (protons) $H^+$ ionized from a water molecule to generate a hydrogen molecule, that is, hydrogen gas, $(2H^+ + 2e^- \rightarrow H_2)$, and the surface 72a thereof functions as a hydrogen gas generation surface. Therefore, the functional layer 72 constitutes the hydrogen gas generation region.

It is preferable that the functional layer 72 is made of, for example, a metal or a conductive oxide (the overvoltage thereof is equal to or less than 0.5 V) or a complex thereof. More specifically, the same transparent conductive film as the transparent electrodes 48, such as ZnO or ITO in which Al, B, Ga, In, or the like is doped or IMO ($In_2O_3$ to which Mo is added) can be used for the functional layer 72. The functional layer 72 may be a single layer structure, similar to the transparent electrode 48, or a laminated structure, such as a two-layer structure. Additionally, the thickness of the functional layer 72 is not particularly limited, is preferably 10 nm to 1000 nm, and is more preferably 50 nm to 500 nm.

In addition, methods for forming the functional layer 72 are not particularly limited, and the functional film can be formed by vapor phase film forming methods or coating methods, such as an electron-beam vapor deposition method, a sputtering method, and a CVD method, similar to the transparent electrode 48.

The co-catalyst 74 includes, for example, simple substances consisting of Pt, Pd, Ni, Au, Ag, Ru, Cu, Co, Rh, Ir, Mn, and the like, alloys obtained by combining these simple substances, and oxides thereof, for example, $NiO_x$ and $RuO_2$. Additionally, the size of the co-catalyst 74 is not particularly limited, and is preferably 0.5 nm to 1 μm.

In addition, methods for forming the co-catalyst 74 are not particularly limited, and the co-catalyst can be formed by a coating baking method, an optical electrodeposition method, a sputtering method, an impregnating method, and the like.

Although it is preferable that the co-catalyst 74 is provided on the surface 72a of the functional layer 72, the co-catalyst may not be provided in a case where sufficient generation of hydrogen gas is possible.

The oxygen gas generating part 34 consists of a region 76 of an extending portion of the back electrode 42 of the photoelectric conversion element 30, and this region 76 becomes the oxygen gas generation region.

Specifically, the region 76 of the extending region of the back electrode 42 of the photoelectric conversion element 30 takes out electrons from hydroxyl ions OH— ionized from a water molecule, and generates an oxygen molecule, that is, an oxygen gas, $(2OH^- \rightarrow H_2O + O_2/2 + 2e^-)$, and functions as the oxygen gas generation surface.

The co-catalyst 78 for generation of oxygen is formed in the shape of lands so as to be dotted on the surface 76a of the region 76 of the back electrode 42.

The co-catalyst 78 for generation of oxygen is made of, for example, $IrO_2$, $COO_x$, or the like. Additionally, the size of the co-catalyst 78 for generation of oxygen is not particularly limited, and is preferably 0.5 nm to 1 μm.

In addition, methods for forming the co-catalyst 78 for generation of oxygen are not particularly limited, and the co-catalyst for generation of oxygen can be formed by a coating baking method, a dipping method, an impregnating method, a sputtering method, a vapor deposition method, and the like.

Hereinafter, respective parts that constitute the artificial-photosynthesis module 10 will be described.

The insulating substrate 40 is not particularly limited if the insulating substrate has insulation and has strength such that the photoelectric conversion unit 12 and the electrolytic chamber 14 can be supported. As the insulating substrate 40, for example, a soda lime glass (SLG) substrate or a ceramic substrate can be used. Additionally, one in which an insulating layer is formed on a metal substrate can be used for the insulating substrate 40. Here, as the metal substrate, a metal substrates, such as an Al substrate or a SUS substrate, or a complex metal substrate, such as a complex Al substrate made of a composite material consisting Al and, for example, with other metal, such as SUS, is available. In addition, the complex metal substrate is also a type of metal substrate, and the metal substrate and the complex metal substrate are collectively also referred to as the metal substrate. Moreover, a metal substrate with an insulating film having an insulating layer formed by anodized the surface of the Al substrate, or the like, can also be used as the insulating substrate 40. The insulating substrate 40 may be a flexible substrate or may not be such a flexible substrate. In addition, in addition to the above-described substrates, for example, glass plates, such as high strain-point glass and alkali-free glass, and a polyimide material can also be used as the insulating substrate 40.

The thickness of the insulating substrate 40 may be an arbitrary thickness without being particularly limited if the photoelectric conversion unit 12 and the electrolytic chamber 14 can be supported. However, for example, the thickness of the insulating substrate may be about 20 μm to 20000 μm, is preferably 100 μm to 10000 μm, and is more preferably 1000 μm to 5000 μm.

In addition, in a case where one including a CIGS-based compound semiconductor is used for the photoelectric conversion layer 44 of the photoelectric conversion element 30 and the pn junction cell 31 of the hydrogen gas generating part 32, the photoelectric conversion efficiency of the photoelectric conversion element 30 are improved if alkali ions (for example, sodium (Na) ions: Na+) are supplied to the insulating substrate 40 side. Thus, it is preferable that an upper surface of the insulating substrate 40 is provided with an alkali supply layer for supplying alkali ions. In addition, for example, the alkali supply layer is unnecessary in the case of the SLG substrate.

The back electrode 42 is made of, for example, metal, such as Mo, Cr, and W, or combination thereof. The back electrode 42 may be a single layer structure, or may be a laminated structures, such as a two-layer structure. The back electrode 42 is preferably made of Mo among them. Although the film thickness of the back electrode 42 is generally about 800 nm, it is preferable that the thickness of the back electrode 42 is 400 nm to 1 μm.

As described, in the photoelectric conversion element 30, the photoelectric conversion layer 44 is a layer in which a pn junction having the photoelectric conversion layer 44 side as a p type and having the buffer layer 46 side as an n type is formed at the interface between the photoelectric conversion layer 44 and the buffer layer 46, and the light transmitted through and reaching the protective layer 50, the transparent electrode 48, and the buffer layer 46 is absorbed to generate a positive hole on the p side and generate an electron on the n side, and has a photoelectric conversion function. In the photoelectric conversion layer 44, the positive hole generated in the pn junction is moved from the photoelectric conversion layer 44 to the back electrode 42 side, and the electron generated in the pn junction is moved from the buffer layer 46 to the transparent electrode 48 side. The film thickness of the photoelectric conversion layer 44 is preferably 1.0 μm to 3.0 μm, and is particularly preferably 1.5 μm to 2.0 μm.

It is preferable that the photoelectric conversion layer 44 is constituted of for example, a CIGS-based compound semiconductor or a CZTS-based compound semiconductor that has a chalcopyrite crystal structure. That is, it is preferable that the photoelectric conversion layer 44 is constituted of the CIGS-based compound semiconductor layer. The CIGS-based compound semiconductor layer may be made of well-known substances used for CIGS systems, such as $CuInSe_2$ (CIS) and $CuGaSe_2$ (CGS) as well as $Cu(In, Ga)Se_2$ (CIGS).

In addition, as methods for a CIGS layer, 1) a multi-source vapor deposition method, 2) a selenide method, 3) a sputtering method, 4) a hybrid sputtering method, 5) mechano-chemical process method, and the like are known.

Other methods for forming the CIGS layer include a screen printing method, a proximity sublimating method, an MOCVD method, a spray method (wet film-forming method), and the like. For example, crystal with a desired composition can be obtained, for example, by forming a particulate film containing an Ib group element, a IIIb group element, and a VIb group element on a substrate, using the screen printing method (wet film-forming method), the spray method (wet film-forming method), or the like, and performing thermal decomposition processing (in this case, may be thermal decomposition processing in a VIb group element atmosphere) or the like (JP1997-74065 (JP-H09-74065) and JP1997-74213 (JP-H09-74213)).

In the invention, as described above, it is preferable that the photoelectric conversion layer 44 is constituted of, for example, the CIGS-based compound semiconductor or the CZTS-based compound semiconductor that has the chalcopyrite crystal structure. However, the invention is not limited to this, and the photoelectric conversion layer may be arbitrary photoelectric conversion elements so long as a pn junction consisting of an inorganic semiconductor can be formed, and hydrogen gas and oxygen gas can be generated by causing a photolysis reaction of water. For example, a photoelectric conversion element used for a solar battery cell that constitutes a solar battery is preferably used. Such a photoelectric conversion element includes a thin film silicon-based thin film type photoelectric conversion element, a CdTe-based thin film type photoelectric conversion element, a dye-sensitization-based thin film type photoelectric conversion element, or an organic thin film type photoelectric conversion element, in addition to a CIGS-based thin film type photoelectric conversion element, a CIS-based thin film type photoelectric conversion element and a CZTS-based thin film type photoelectric conversion element.

In addition, the absorption wavelength of an inorganic semiconductor that forms the photoelectric conversion layer 44 is not particularly limited if the absorption wavelength is in a wavelength band where photoelectric conversion is allowed. Although it is sufficient if the absorption wavelength includes the wavelength band of solar light or the like, particularly, the visible wavelength band to the infrared wavelength band, it is preferable that the absorption wavelength end of the absorption wavelength includes 800 nm or more, that is, the infrared wavelength band. This is because solar light energy can be utilized as much as possible. Meanwhile the absorption wavelength end having a long wavelength is equivalent to a band gap becoming small, and it can be expected from this that an electromotive force for assisting water decomposition decreases. As a result, since it can be expected that the number of connections to be connected in series for the water decomposition increases, it is not necessarily good that the absorption end is longer.

The buffer layer 46 constitutes the inorganic semiconductor film 47 that has the pn junction together with the photoelectric conversion layer 44 as described above. The buffer layer 46 protects the photoelectric conversion layer 44 when the transparent electrode 48 is formed, and is formed in order to transmit the light, which has entered the transparent electrode 48, through the photoelectric conversion layer 44.

It is preferable that the buffer layer 46 includes, for example, metal sulfide containing at least one kind of metallic elements selected from a group consisting of Cd, Zn, Sn, and In, such as CdS, ZnS, Zn (S, O), and/or Zn (S, O, OH), SnS, Sn (S, O), and/or Sn (S, O, OH), InS, In (S, O), and/or In (S, O, OH). The film thickness of the buffer layer 46 is preferably 10 nm to 2 μm, and is more preferably 15 nm to 200 nm. The buffer layer 46 is formed by, for example, a chemical bath deposition method (hereinafter referred to as a CBD method).

In addition, for example, a window layer may be provided between the buffer layer 46 and the transparent electrode 48. This window layer is constituted of, for example, a ZnO layer with a thickness of about 10 nm.

The transparent electrode 48 has translucency, takes light into the photoelectric conversion layer 44, makes a pair together with the back electrode 42, functions as an electrode that moves a positive hole and an electron generated in the photoelectric conversion layer 44 (an electric current flows), and functions as a transparent conductive film for connecting the two photoelectric conversion elements 30 in series.

The transparent electrode 48 is made of, for example, ZnO or ITO in which Al, B, Ga, In, or the like is doped. The transparent electrode 48 may be a single layer structure, or may be a laminated structures, such as a two-layer structure. Additionally, the thickness of the transparent electrode is not limited, and is preferably 0.3 μm to 1 μm.

In addition, methods for forming the transparent electrode are not particularly limited, and the functional film can be formed by vapor phase film forming methods or coating methods, such as an electron-beam vapor deposition method, a sputtering method, and a CVD method.

In addition, although the transparent conductive film for connecting the adjacent photoelectric conversion elements 30 in series is not necessarily limited to the transparent electrode 48, it is good to simultaneously form the same transparent conductive film as the transparent electrode 48 from the viewpoint of easiness of manufacture.

That is, a conductive film for connecting the adjacent photoelectric conversion elements 30 in series can be formed by forming the opening groove P2 reaching the surface of the back electrode 42 on the photoelectric conversion layer 44 by a laser scribe or a mechanical scribe after the buffer layer 46 is laminated, forming a transparent conductive film constituting the transparent electrode 48 on the buffer layer 46 so as to fill the opening groove P2 and then removing the transparent conductive film within each opening groove P2 by a scribe to form a slightly narrow opening groove P2 again reaching the surface of the back electrode 42, and leaving the conductive film for directly connecting the back electrode 42 and the transparent electrode 48 of the adjacent photoelectric conversion elements 30.

In the photoelectric conversion unit 12, if light L enters the photoelectric conversion elements 30 from the protective layer 50 side, this light L passes through the protective layer 50, each transparent electrode 48, and each buffer layer 46, and an electromotive force is generated in each photoelectric conversion layer 44, for example, an electric current (movement of a positive hole) that faces the back electrode 42 from the transparent electrode 48 is generated. For this reason, in the photoelectric conversion unit 12, the hydrogen gas generating part 32 becomes a negative electrode (a cathode for electrolysis), and the oxygen gas generating part 34 becomes a positive electrode (an anode for electrolysis). In addition, the type (polarity) of generated gases in the photoelectric conversion unit 12 varies appropriately according to the configuration of the photoelectric conversion elements 30, the configuration of the photoelectric conversion unit 12, or the like.

Next, a method for manufacturing the artificial-photosynthesis module 10 will be described.

In addition, the method for manufacturing the artificial-photosynthesis module 10 is not limited to a manufacturing method illustrated below.

First, for example, a soda lime glass substrate that becomes the insulating substrate 40 is prepared.

Next, for example, an Mo film or the like that becomes the back electrode 42 is formed on the surface of the insulating substrate 40 by the sputtering method using a film formation apparatus.

Next, a separation groove P1 extending in the width direction W (refer to FIG. 1) of the insulating substrate 40 is formed by scribing the Mo film at a predetermined position, for example, using the laser scribe method. Accordingly, the back electrode 42 separated from each other by the separation groove P1 is formed.

Next, for example, a CIGS film (p-type semiconductor layer) is formed as the photoelectric conversion layer 44 so as to cover the back electrode 42 and fill the separation groove P1. This CIGS film is formed by any one of the aforementioned film formation methods.

Next, for example, a CdS layer (n-type semiconductor layer) that becomes the buffer layer 46 is formed on the photoelectric conversion layer 44 by the CBD method.

Next, two opening grooves P2 that extend in the width direction W (refer to FIG. 1) of the insulating substrate 40 and reach the surface of the back electrode 42 through the photoelectric conversion layer 44 from the buffer layer 46 are formed at positions different from the formation position of the separation groove P1 in the direction M by, for example, the scribe method. In this case, a laser scribe method or a mechanical scribe method can be used as the scribe method.

Next, a ZnO layer that becomes the transparent electrode 48, and has, for example, Al, B, Ga, Sb, or the like added thereto is formed by the sputtering method or the coating method so as to extend in the width direction W (refer to FIG. 1) of the insulating substrate 40 and fill each opening groove P2 on the buffer layer 46.

Next, two slightly narrow opening grooves P2 reaching the surface of the back electrode 42 are formed again, for example, by the scribe method by removing the other portion so as to leave a portion of the ZnO layer within the opening groove P2. Even this case, the laser scribe method or the mechanical scribe method can be used as the scribe method.

Next, for example, an $SiO_2$ film that becomes the protective layer 50 is formed in the outer surfaces of the photoelectric conversion elements 30 that constitute the photoelectric conversion unit 12, the surface of the back electrode 42 on the bottom surfaces of the two opening grooves P2, the side surface 49 of the photoelectric conversion element 30, and the side surface 33 of the pn junction cell 31 by the RF sputtering method. Accordingly, the two photoelectric conversion elements 30 can be formed.

Next, the ZnO layer formed in the pn junction cell 31 that becomes the hydrogen gas generating part 32 is peeled using the laser scribe method or the mechanical scribe method, and for example, the ZnO layer to which Al, B, Ga, Sb, or the like is added is formed as the functional layer 72 on the surface of the exposed buffer layer 46 by the sputtering method using a patterning mask, or the coating method.

Next, for example, a Pt co-catalyst that becomes the co-catalyst 74 for generation of hydrogen is carried in the functional layer 72 by an optical electrodeposition method.

Next, the region 76 is exposed by removing the deposit on the region 76 of the extending portion of the back electrode 42 of the photoelectric conversion element 30 on the side that is not adjacent to the hydrogen gas generating part 32, using the laser scribe method or the mechanical scribe method.

Then, for example, a $CoO_x$ co-catalyst that becomes the co-catalyst 78 for generation of oxygen is carried in the surface 76a of the region 76, for example, by the dipping method.

Next, the groove H that passes through the back electrode 42 and the insulating substrate 40 is formed by a well-known method.

Then, the container 60 that is prepared in advance and constitutes each electrolytic chamber 14 is arranged to surround the hydrogen gas generating part 32 and the oxygen gas generating part 34. Accordingly, the electrolytic chambers 14 are formed.

Next, the artificial-photosynthesis module 10 can be manufactured by connecting the supply tube 17, the recovery pipe 19, the pipe 21 for hydrogen, and the pipe 23 for oxygen to the electrolytic chambers 14, and using these as the supply part 16, the recovery part 18, the hydrogen gas recovery part 20, and the oxygen gas recovery part 22, respectively.

In the artificial-photosynthesis module 10, the photoelectric conversion unit 12 is irradiated with light L and the aqueous electrolyte solution AQ is supplied from the supply part 16 to each electrolytic chamber 14. As a result, the aqueous electrolyte solution AQ is decomposed by the hydrogen gas generating part 32 within each electrolytic chamber 14 and thereby hydrogen gas is generated, and the aqueous electrolyte solution AQ is decomposed by the oxygen gas generating part 34 and thereby oxygen gas is generated. The hydrogen gas is recovered by the hydrogen gas recovery part 20 via the pipe 21 for hydrogen. The oxygen gas is recovered by the oxygen gas recovery part 22 via the pipe 23 for oxygen.

Additionally, in the artificial-photosynthesis module 10, by providing the electrolytic chambers 14, it is unnecessary to performing immersion in the entire aqueous electrolyte solution AQ, and degradation of performance caused by immersion can be avoided.

Moreover, since the aqueous electrolyte solution AQ is electrolyzed and the hydrogen gas and the oxygen gas are obtained within the electrolytic chambers 14, the areas of the electrolytic chambers 14 can be made small.

Figure 3A:
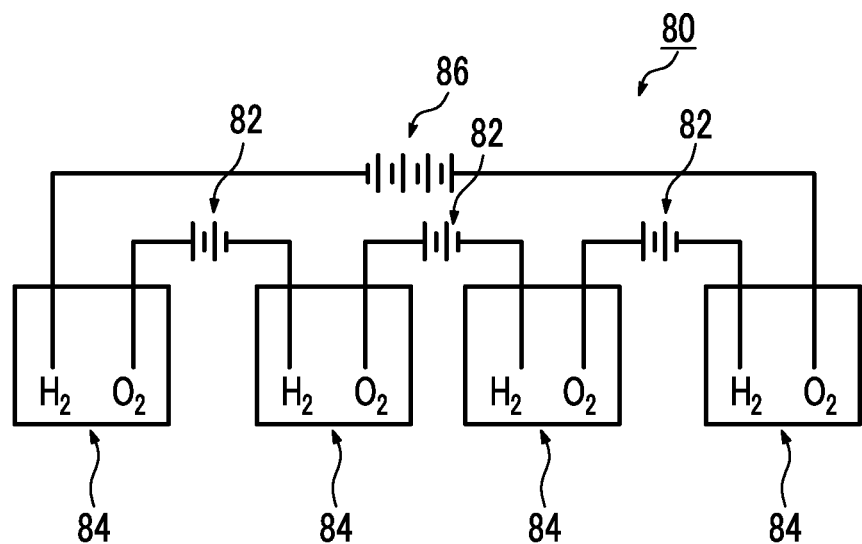
FIG. 3A is an equivalent circuit diagram of the artificial-photosynthesis module of the first embodiment of the invention.

The artificial-photosynthesis module 10 can be expressed as an equal circuit 80 as illustrated in FIG. 3A, if illustrated as an electric circuit. In the equal circuit 80, power source parts 82 are equivalent to the photoelectric conversion units 12 illustrated in FIG. 1, and electrolytic chamber parts 84 are equivalent to the electrolytic chambers 14 illustrated in FIG. 1. Additionally, an electromotive force part 86 connected to the electrolytic chamber parts 84 at both ends is equivalent to one in which the photoelectric conversion units 12 at both ends illustrated in FIG. 1 are connected together with the wiring 13. One battery of a power source part 82 and the electromotive force part 86 is equivalent to one photoelectric conversion element 30.

In the equal circuit 80 illustrated in FIG. 3A, ten photoelectric conversion elements 30 are connected in series. If the electromotive force of one photoelectric conversion element 30 is 0.8 V, the electromotive force of the entire artificial-photosynthesis module 10 is 8 V. The voltage applied to each of the four electrolytic chamber parts 84 is 8 V/4 pieces, that is, 2 V/1 piece. Here, since a voltage required for electrolyzing water is 2.0 V as described above, in each electrolytic chamber 14, generation of surplus energy equivalent to a voltage equal to or higher than the practical electrolysis start voltage of water, and an energy loss can also be suppressed.

Figure 5:
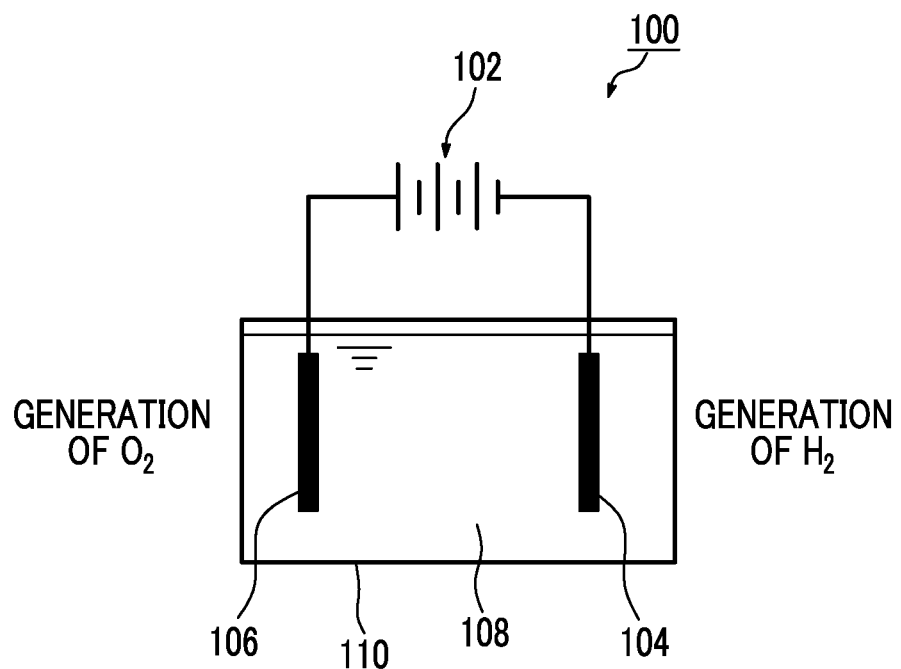
FIG. 5 is a schematic view illustrating a related-art water electrolysis apparatus for water.

In contrast, in the related-art example illustrated in the above-described FIG. 5, an energy loss was the loss of 0.4 V. In the artificial-photosynthesis module 10 of the present embodiment, an energy loss can be made smaller than that of the related art. In this way, hydrogen gas and oxygen gas can be efficiently obtained. As a result, hydrogen gas can be cheaply manufactured.

Additionally, when the plurality of photoelectric conversion units 12 are irradiated with light, it is preferable that the amounts of generated currents and generated voltages that are generated in the respective photoelectric conversion units 12 are equal. However, since a voltage with a value obtained by dividing the voltage of the entire artificial-photosynthesis module 10 by the number of electrolytic chambers 14 is applied to the electrolytic chambers 14, even if there are photoelectric conversion units having a voltage equal to or lower than a predetermined voltage among the plurality of photoelectric conversion units 12, a dropped voltage can be supplemented in the other photoelectric conversion units 12.

Figure 3B:
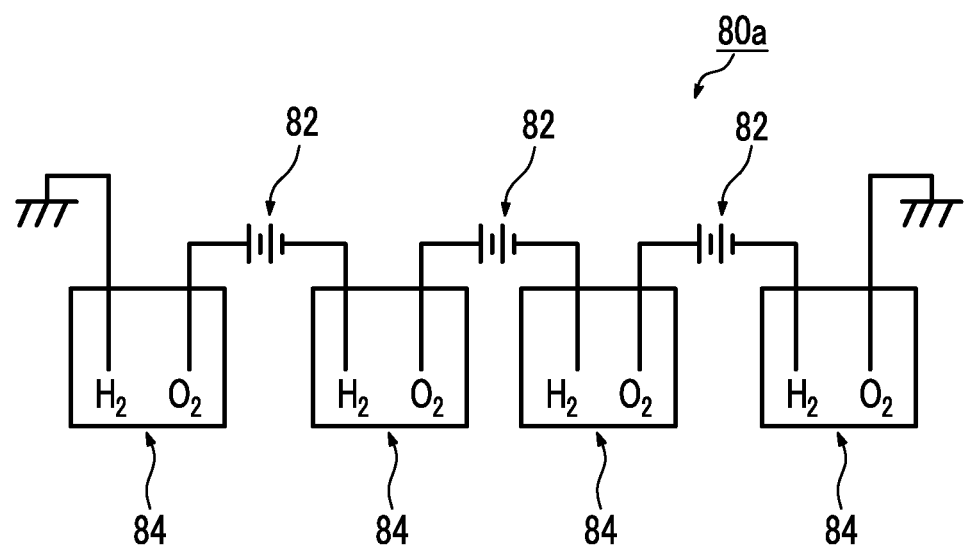
FIG. 3B is an equivalent circuit diagram of another example of the artificial-photosynthesis module of the first embodiment of the invention.

Additionally, as described above, the photoelectric conversion units 12 at the respective ends may be grounded, respectively. In this case, however, as in an equal circuit 80$a$ illustrated in FIG. 3B, an electrode on an oxygen generation side of an electrolytic chamber part 84 at one end is grounded, and an electrode on a hydrogen generation side of the electrolytic chamber part 84 on the other end is grounded. Even in this configuration, the same effects as those of the artificial-photosynthesis module 10 can be obtained by adjusting the sum of the voltages of the respective power source parts 82.

Next, a second embodiment of the invention will be described.

Figure 4:
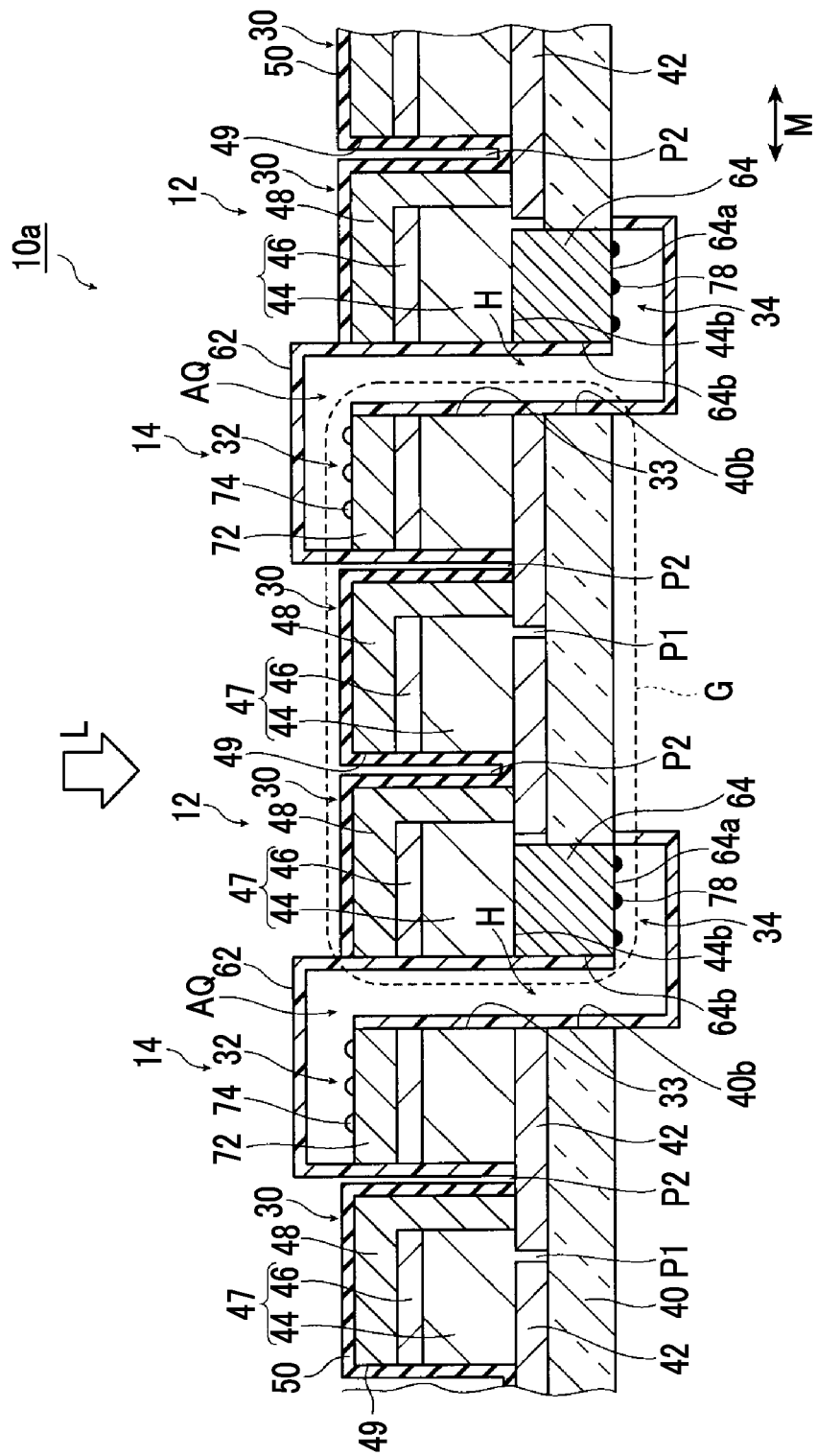
FIG. 4 is a schematic sectional view illustrating an artificial-photosynthesis module of a second embodiment of the invention.

FIG. 4 is a schematic sectional view illustrating an artificial-photosynthesis module of a second embodiment of the invention.

In the artificial-photosynthesis module 10$a$ of the present embodiment, the same structures as those of the artificial-photosynthesis module 10 illustrated in FIGS. 1 and 2 will be designated by the same reference signs, and the detailed description thereof will be omitted.

Since the artificial-photosynthesis module 10$a$ illustrated in FIG. 4 is the same as the artificial-photosynthesis module 10 illustrated in FIGS. 1 and 2 except that, compared that the artificial-photosynthesis module 10 illustrated in FIGS. 1 and 2, the configuration of the electrolytic chambers 14, and the arrangement positions of the hydrogen gas generating part 32 and the oxygen gas generating part 34 vary and these generating parts are provided on the surfaces opposite to each other with respect to the insulating substrate, the detailed description thereof will be omitted.

In the artificial-photosynthesis module 10$a$, the oxygen gas generating part 34 is not provided in the region 76 of the extending portion of the back electrode 42, and a conductive film 64 is provided on a rear surface 44$b$ of the photoelectric conversion layer 44 of each photoelectric conversion element 30. A co-catalyst 78 for generation of oxygen is formed in the shape of lands so as to be dotted on a surface 64$a$ of the conductive film 64. The hydrogen gas generating part 32 and the oxygen gas generating part 34 are provided not on the same plane but on the surfaces opposite to each other with respect to the insulating substrate 40.

The conductive film 64 is not particularly limited if the conductive film has conductivity, and the same material as the back electrode 42 can be used for the conductive film.

Additionally, the hydrogen gas generating part 32 of a water-decomposing element G and the oxygen gas generating part 34 adjacent thereto are spaced apart from each other by the groove H, and the oxygen gas generating part 34 of a water-decomposing element G and the hydrogen gas generating part 32 adjacent thereto are also spaced apart from each other by the groove H, and thereby element separation is performed. In the present embodiment, each water-decomposing element G is not formed over the entire region in the width direction W of the insulating substrate 40, and the groove H is not formed over the entire region in the width direction W of the insulating substrate 40.

As each electrolytic chamber 14 of the present embodiment, the container 62 arranged so as to surround the hydrogen gas generating part 32 on the front surface side and the oxygen gas generating part 34 on the back side is provided. The container 62 comes in contact with the side surface 33 of the hydrogen gas generating part 32 (pn junction cell 31), a side surface 40$b$ of the insulating substrate 40, and a side surface 64$b$ of the conductive film 64, respectively. The aqueous electrolyte solution AQ is supplied into the container 62, and the aqueous electrolyte solution AQ is supplied to the hydrogen gas generating part 32 and the oxygen gas generating part 34.

Next, a method for manufacturing the artificial-photosynthesis module 10$a$ will be described. In addition, the method for manufacturing the artificial-photosynthesis module 10$a$ is not limited to a manufacturing method illustrated below.

Additionally, in the method for manufacturing the artificial-photosynthesis module 10$a$, the detailed description of the same processes as those of the method for manufacturing the artificial-photosynthesis module 10 of the first embodiment will be omitted.

In the method for manufacturing the artificial-photosynthesis module 10$a$, since processes up to a process of first preparing a soda lime glass substrate that becomes the insulating substrate 40, and then forming the hydrogen gas generating part 32 and the photoelectric conversion unit 30 are the same processes as those of the method for manufacturing the artificial-photosynthesis module 10, the detailed description thereof will be omitted.

After the photoelectric conversion elements 30 and the hydrogen gas generating part 32 are formed, the insulating substrate 40 and the back electrode 42 that are present in the formation schedule region of the oxygen gas generating part 34 are removed by, for example, the scribe method, and the rear surface 44$b$ of the photoelectric conversion layer 44 is exposed.

Then, the conductive film 64 is formed on the rear surface 44$b$ of the photoelectric conversion layer 44, for example, by the sputtering method using a patterning mask.

Then, for example, a $CoO_x$ co-catalyst that becomes the co-catalyst 78 for generation of oxygen is carried in the surface 64a of the conductive film 64, for example, by the dipping method.

Next, the groove H that passes through the back electrode 42 and the insulating substrate 40 is formed by a well-known method.

Then, the container 62 that constitutes each electrolytic chamber 14 is attached. The artificial-photosynthesis module 10a can be manufactured in this way.

Even in the artificial-photosynthesis module 10a of the present embodiment, each photoelectric conversion element 30 is irradiated with the light L, and the aqueous electrolyte solution AQ is supplied to the hydrogen gas generating part 32 and the oxygen gas generating part 34, respectively. An electromotive force is generated in the photoelectric conversion element 30 by the irradiation of the light L, the aqueous electrolyte solution AQ is decomposed in each hydrogen gas generating part 32 by the electrical energy of the photoelectric conversion element 30, and thereby hydrogen gas is generated, and the hydrogen gas is recovered by the hydrogen gas recovery part 20 via the pipe 21 for hydrogen. In each oxygen gas generating part 34, the aqueous electrolyte solution AQ is decomposed, and thereby oxygen gas is generated, and the oxygen gas is recovered by the oxygen gas recovery part 22 via the pipe 23 for oxygen.

The artificial-photosynthesis module 10a of the present embodiment is the same as the artificial-photosynthesis module 10 of the first embodiment in terms of its basic configuration although the configuration of the oxygen gas generating part 34 differs, and the same effects as those of the artificial-photosynthesis module 10 of the first embodiment can be obtained. For this reason, hydrogen gas and oxygen gas can be efficiently obtained. As a result, hydrogen gas can be cheaply manufactured.

The invention is basically configured as described above. Although the artificial-photosynthesis module of the invention has been described above in detail, the invention is not limited to the above embodiments, and various improvements or modifications may be made without departing from the scope of the invention.

EXPLANATION OF REFERENCES

- 10: artificial-photosynthesis module
- 12: photoelectric conversion unit
- 14: electrolytic chamber
- 16: supply part
- 18: recovery part
- 20: hydrogen gas recovery part
- 22: oxygen gas recovery part
- 30: photoelectric conversion element
- 32: hydrogen gas generating part
- 34: oxygen gas generating part
- 40: insulating substrate
- 42: back electrode
- 44: photoelectric conversion layer
- 46: buffer layer
- 48: transparent electrode
- 50: protective layer
- 62: container
- 64: conductive film
- 72: functional layer
- 80: equal circuit
- 82: power source part
- 84: electrolytic chamber part
- 86: electromotive force part
- 100: related-art water electrolysis apparatus

What is claimed is:

1. An artificial-photosynthesis module that decomposes an aqueous electrolyte solution into hydrogen and oxygen by means of light, the artificial-photosynthesis module comprising:
   a plurality of photoelectric conversion units that receive light to generate electrical energy;
   a plurality of hydrogen gas generating parts that decompose the aqueous electrolyte solution, using the electrical energy of the plurality of photoelectric conversion units, and generate hydrogen gas; and
   a plurality of oxygen gas generating parts that decompose the aqueous electrolyte solution, using the electrical energy of the plurality of photoelectric conversion units, and generate oxygen gas,
   wherein the plurality of photoelectric conversion units, the plurality of hydrogen gas generating parts, and the plurality of oxygen gas generating parts are electrically connected in series, and one of the plurality of the hydrogen gas generating parts and one of the plurality of the oxygen gas generating parts are arranged within a same one of a plurality of electrolytic chambers to which the aqueous electrolyte solution is supplied,
   wherein one of the plurality of hydrogen gas generating parts arranged within the same one of the plurality of the electrolytic chambers is electrically connected to one of the plurality of photoelectric conversion units, and one of the plurality of oxygen gas generating parts arranged within the same one of the plurality of the electrolytic chambers is electrically connected to another of the plurality of photoelectric conversion units,
   wherein each of the plurality of the hydrogen gas generating parts has an inorganic semiconductor film having a pn junction, and
   wherein in the same one of the plurality of electrolytic chambers, one of the plurality of the photoelectric conversion units, one of the plurality of the hydrogen gas generating parts, and one of the plurality of the oxygen gas generating parts are provided on a same plane.

2. An artificial-photosynthesis module that decomposes an aqueous electrolyte solution into hydrogen and oxygen by means of light, the artificial-photosynthesis module comprising:
   a plurality of photoelectric conversion units that receive light to generate electrical energy;
   a plurality of hydrogen gas generating parts that decompose the aqueous electrolyte solution, using the electrical energy of the plurality of photoelectric conversion parts, and generates hydrogen gas; and
   a plurality of oxygen gas generating parts that decompose the aqueous electrolyte solution, using the electrical energy of the plurality of photoelectric conversion parts, and generate oxygen gas,
   wherein the plurality of photoelectric conversion units, the plurality of hydrogen gas generating parts, and the plurality of oxygen gas generating parts are electrically connected in series, and one of the plurality of the hydrogen gas generating parts and one of the plurality of the oxygen gas generating parts are arranged within a same one of a plurality of electrolytic chambers to which the aqueous electrolyte solution is supplied, wherein one of the plurality of hydrogen gas generating parts arranged within the same one of the plurality of the electrolytic chambers is electrically connected to one of the plurality of photoelectric conversion units, and one of the plurality of oxygen gas generating parts arranged within the same one of the plurality of the electrolytic chambers is electrically connected to another of the plurality of photoelectric conversion units, wherein each of the plurality of the hydrogen gas generating parts has an inorganic semiconductor film having a pn junction, and wherein in the same one of the plurality of electrolytic chambers, one of the plurality of hydrogen gas generating parts and one of the plurality of photoelectric conversion units are provided on a same plane, and one of the plurality of the hydrogen gas generating parts and one of the plurality of the oxygen gas generating parts are provided on mutually different planes.

3. The artificial-photosynthesis module according to claim 1, wherein a plurality of photoelectric conversion elements of the plurality of photoelectric conversion units are connected in series.

4. The artificial-photosynthesis module according to claim 2, wherein a plurality of photoelectric conversion elements of the plurality of photoelectric conversion units are connected in series.

5. The artificial-photosynthesis module according to claim 3, wherein each of the photoelectric conversion elements includes an inorganic semiconductor film having a pn junction.

6. The artificial-photosynthesis module according to claim 5, wherein the inorganic semiconductor film includes a CIGS compound semiconductor.

7. The artificial-photosynthesis module according to claim 5, wherein the inorganic semiconductor film includes a CZTS compound semiconductor.

8. The artificial-photosynthesis module according to claim 1, wherein the inorganic semiconductor film of the plurality hydrogen gas generating parts is covered with a functional layer, and the functional layer is insoluble in a weak acidic solution and a weak alkaline solution, and has all light permeability, water impermeability, and conductivity.

9. The artificial-photosynthesis module according to claim 2, wherein the inorganic semiconductor film of the plurality hydrogen gas generating parts is covered with a functional layer, and the functional layer is insoluble in a weak acidic solution and a weak alkaline solution, and has all light permeability, water impermeability, and conductivity.

10. The artificial-photosynthesis module according to claim 8, wherein the functional layer has a co-catalyst provided on the surface thereof, and the co-catalyst is made of Pt, a substance containing Pt, or Rh.

11. The artificial-photosynthesis module according to claim 1, wherein the plurality of photoelectric conversion units is covered with a protective layer, and the protective layer is insoluble in a weak acidic solution and a weak alkaline solution, and has all of light permeability, water impermeability, and insulation.

12. The artificial-photosynthesis module according to claim 2, wherein the plurality of photoelectric conversion units is covered with a protective layer, and the protective layer is insoluble in a weak acidic solution and a weak alkaline solution, and has all of light permeability, water impermeability, and insulation.

13. The artificial-photosynthesis module according to claim 1, wherein a co-catalyst is provided in the plurality of oxygen gas generating parts, and the co-catalyst for the oxygen generation is made of $CoO_x$ or $IrO_2$.

14. The artificial-photosynthesis module according to claim 2, wherein a co-catalyst is provided in the plurality of oxygen gas generating parts, and the co-catalyst for the oxygen generation is made of $CoO_x$ or $IrO_2$.

15. The artificial-photosynthesis module according to claim 3, wherein when the plurality of photoelectric conversion units is irradiated with light, the amounts of generated currents generated in the respective photoelectric conversion elements are equal in the respective photoelectric conversion elements.

16. The artificial-photosynthesis module according to claim 5, wherein when the plurality of photoelectric conversion units is irradiated with light, the amounts of generated currents generated in the respective photoelectric conversion elements are equal in the respective photoelectric conversion elements.

17. The artificial-photosynthesis module according to claim 4, wherein each of the photoelectric conversion elements includes an inorganic semiconductor film having a pn junction.

18. The artificial-photosynthesis module according to claim 4, wherein when the plurality of photoelectric conversion unit is irradiated with light, the amounts of generated currents generated in the respective photoelectric conversion elements are equal in the respective photoelectric conversion elements.

* * * * *